United States Patent

Tanaka et al.

[11] Patent Number: 5,851,440
[45] Date of Patent: Dec. 22, 1998

[54] SEMICONDUCTOR DEVICE AND LIQUID CRYSTAL DISPLAY APPARATUS USING THE SAME

[75] Inventors: Takeshi Tanaka, Mobara; Yoshiro Mikami, Hitachi, both of Japan

[73] Assignee: Hitachi, Ltd., Tokyo, Japan

[21] Appl. No.: 717,236

[22] Filed: Sep. 20, 1996

[30] Foreign Application Priority Data

Sep. 20, 1995 [JP] Japan .................................. 7-241227

[51] Int. Cl.$^6$ .................................................. H01L 29/76
[52] U.S. Cl. .............................. 257/66; 257/347; 349/42
[58] Field of Search .............................. 257/59, 72, 347, 257/348, 350, 351, 212; 349/42

[56] References Cited

U.S. PATENT DOCUMENTS

| 5,151,587 | 9/1992 | Machida et al. | 250/208.1 |
| 5,530,266 | 6/1996 | Yonehara et al. | 257/72 |
| 5,710,606 | 1/1998 | Nakajima et al. | 349/42 |

OTHER PUBLICATIONS

H. Ohshima et al., "Full–Color LCDs with Completely Integrated Drivers Utilizing Low–Temperature Poly–Si TFTs", SID 93 Digest, pp. 387–390.

*Primary Examiner*—Sara W. Crane
*Attorney, Agent, or Firm*—Antonelli, Terry, Stout & Kraus, LLP

[57] ABSTRACT

A liquid crystal display apparatus has a display region in the substrate and a peripheral circuit region for driving the display region formed in the periphery, and monopolar thin film semiconductor elements and bipolar thin film semiconductor elements are formed in the peripheral circuit region and monopolar thin film semiconductor elements or bipolar thin film semiconductor elements are formed in the display region. In the semiconductor film of the monopolar semiconductor element and the bipolar semiconductor element, both of a zone containing a high concentration n-type impurity and a zone containing a high concentration p-type impurity are formed. The liquid crystal display apparatus consumes a small amount of electric power.

21 Claims, 9 Drawing Sheets

SEMICONDUCTOR DEVICE AND LIQUID CRYSTAL DISPLAY APPARATUS USING THE SAME

BACKGROUND OF THE INVENTION

The present invention relates to a semiconductor device and a liquid crystal display apparatus using the semiconductor device, and more particularly to a thin film semiconductor device and a liquid crystal display apparatus of on-board peripheral circuit type using the thin film semiconductor device.

A liquid crystal display apparatus of active matrix type has thin film transistors (TFTs) and liquid crystal pixels driven by the thin film transistors near the intersecting points of a plurality of scanning wires and a plurality of signal wires. The scanning wires and the signal wires are supplied with scanning signals and image signals from peripheral driving circuits. The liquid crystal display apparatus of on-board peripheral circuit type is formed to embed the peripheral circuits on the substrate using the TFTs. The peripheral circuit usually employs a CMOS circuit composed of an n-type TFT which becomes ON-state when a positive voltage is applied to the gate and a p-type TFT which becomes ON-state when a negative voltage is applied to the gate. An example is described in "Full-Color LCDs with Completely Integrated Drivers Utilizing Low-Temperature Poly-Si TFTs" SID 93 Digest, pp 387–390. The CMOS circuit has an advantage in that the CMOS circuit composed of only n-type TFTs is small in consuming electric power compared with a NMOS circuit. The TFT requires semiconductor layers added with impurities of a high concentration called as contact layers, that is, requires high impurity concentration semiconductor zones. An n-type impurity is used for forming the n-type TFT and a p-type impurity is used for forming the p-type TFT.

However, in the above conventional technology, there is not sufficient consideration on simplification of the circuit forming process. That is, in order to forming the desired high impurity concentration semiconductor zone, there are required a process for masking the n-type TFT when the p-type TFT is formed and a process for masking the p-type TFT when the n-type TFT is formed.

SUMMARY OF THE INVENTION

An object of the present invention is to provide a semiconductor device and a liquid crystal display apparatus which can be produced through a simple process.

Another object of the present invention is to provide a semiconductor device and a liquid crystal display apparatus which is small in electric power consumption.

According to the present invention, the liquid crystal display apparatus comprises a display region in the substrate and a peripheral circuit region for driving the display region formed in the periphery, and there are monopolar semiconductor elements and bipolar semiconductor elements in the peripheral circuit region. It is preferable that monopolar semiconductor elements or bipolar semiconductor elements are formed in the display region. Further, it is preferable that the semiconductor elements are thin film semiconductor elements (TFT).

As an embodiment, the monopolar semiconductor element and bipolar semiconductor element are constructed by a bipolar TFT which has both of n-type and p-type functions by one TFT and a monopolar TFT which has either of n-type or p-type function by one TFT. In the semiconductor film of these TFT, both of a zone containing high concentration n-type impurity (hereinafter referred to as "$n^+$-zone") and a zone containing high concentration p-type impurity (hereinafter referred to as "$p^+$-zone") are formed.

In the bipolar TFT, the $p^+$-zone and the $n^+$-zone are disposed within the range of the region of the gate electrode seeing from the vertical direction of the substrate. On the other hand, in the monopolar TFT, one of the $p^+$-zone and the $n^+$-zone is disposed within the range of the region of the gate electrode seeing from the vertical direction of the substrate.

By constructing an inverter circuit using the bipolar TFT and the monopolar TFT, the consuming electric power can be decreased. The inverters composes a shift register.

Initially, the bipolar TFT and the monopolar TFT will be described below. In both kinds of the TFTs, when a positive voltage above the threshold voltage applied to the gate electrode, high density electrons are induced in the semiconductor film. When a negative voltage is applied, high density holes are induced in the semiconductor film. The zone where high density electrons or holes are induced is called as a channel of which conductivity becomes high. In the bipolar TFT, an $n^+$-zone and a $p^+$-zone for connecting with a source drain electrode are provided in a portion of the semiconductor film which overlaps with the gate electrode. The $n^+$-zone has a function to interrupt holes to flow but to allow electrons to flow. On the contrary, the $p^+$-zone has a function to interrupt electrons to flow but to allow holes to flow. Therefore, when a positive voltage is applied to the gate, electrons flow from the source electrode to the drain electrode through the $n^+$-zone, the channel and the $n^+$-zone. On the other hand, when a negative voltage is applied to the gate, holes flow from the source electrode to the drain electrode through the $p^+$-zone, the channel and the $p^+$-zone. That is, in any case where either a positive voltage or a negative voltage is applied, a conductive path is produced between the source electrode and the drain electrode to allow current to flow. In other words, the circuit becomes a bipolar TFT which is operated by both polarity.

Next, the monopolar TFT will be described below. A characteristic of the monopolar TFT is that one of the high concentration impurity zone is apart form the gate electrode in a plan view. The following description will be made on a case where a part of the $n^+$-zone overlaps with the gate electrode and the $p^+$-zone is apart from the gate electrode. As the same as in the bipolar TFT, when a positive voltage or a negative voltage above the threshold voltage applied to the gate electrode, high density electrons are induced in the semiconductor film. The zone becoming a channel is the same plan shape as that of the gate electrode. Therefore, at least a part of the $n^+$-zone is in contact with the channel zone. There is a current path flowing through the $n^+$-zone, that is, the current path when a positive voltage is applied to the gate. On the other hand, the $p^+$-zone does not overlap with the channel but is apart from the channel, and there is a high resistant semiconductor film between them. The $p^+$-zone is interrupted from the channel. Holes in the $p^+$-zone cannot reach the channel. The conduction path of holes is interrupted. Thereby, the TFT operates only by conduction of electrons, that is, the TFT is an n-type monopolar TFT which operates only when a positive voltage is applied to the gate.

Comparison will be made between the constructions of the bipolar TFT and the monopolar TFT. Although positional relationship of the $n^+$-zone, the $p^+$-zone and the gate electrode is different between them, they have the $n^+$-zone and the p+-zone and the structural elements are the same. They can be formed in the same process of forming the TFTs at a time. Different from the conventional CMOS, it is not necessary to masking p-type TFTs when n-type TFTs are forming nor to masking n-type TFTs when p-type TFTs are forming. Therefore, according to the present invention, the different conduction types of TFTs can be formed through a simple process.

An inverter is constructed using the bipolar TFT and the monopolar TFT (description will be made as an n-type TFT). One of the monopolar TFT and the bipolar TFT is not conducting since conduction types are different, which will be described in detail later in the section of Detailed Description of the Preferred Embodiments. Therefore, current flows only when input to the inverter changes and current hardly flows during stand-by period, and consequently the inverter consuming electric power becomes small. Further, since the other TFT becomes conducting and the output current is large, the inverter has a high operating speed.

Since the peripheral circuit is incorporated on the substrate of the liquid crystal display apparatus, an external driving IC is not required or can be eliminated, and accordingly the liquid crystal display apparatus becomes small in size, light in weight and low in cost. Since the peripheral circuit is constructed using the bipolar TFTs and the monopolar TFTs, the consuming electric power can be decreased. Since the bipolar TFTs and the monopolar TFTs are formed through a simple process, the liquid crystal display apparatus can be manufactured with a low cost.

DETAILED DESCRIPTION OF THE PREFERRED EMBODIMENTS

Embodiments of the present invention will be described in detail below.

Figure 1:
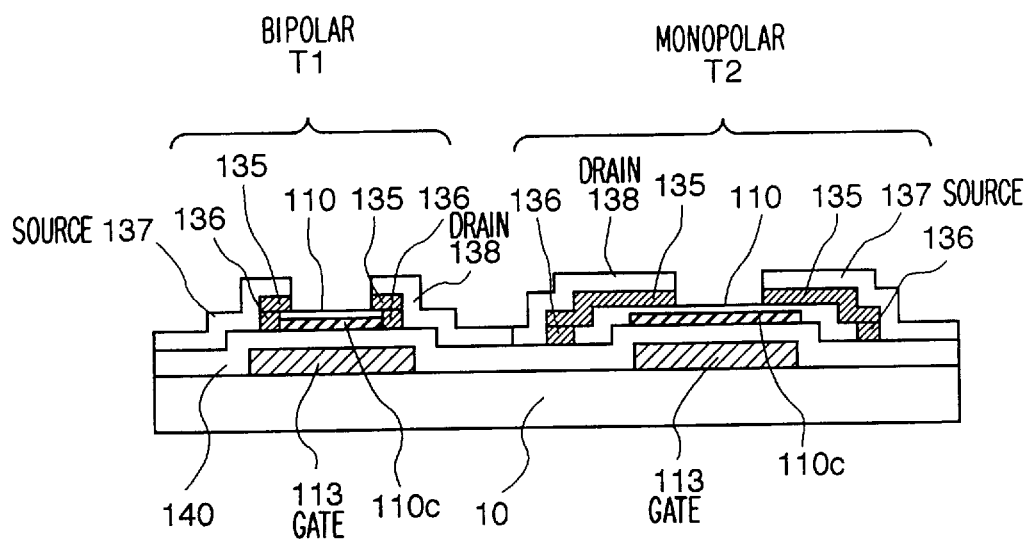
FIG. 1 is a view showing the cross-sectional construction of an embodiment of a bipolar and a monopolar thin film transistors in accordance with the present invention.

The construction and the operating mechanism of the bipolar TFT and the monopolar TFT (n-type monopolar TFT in this embodiment) will be described in detail below. FIG. 1 shows cross-sectional constructions of the bipolar TFT (T1) and the monopolar TFT (T2). Each of the TFTs is a reverse stagger type TFT in which a gate electrode 113, a gate insulator film 140, a source electrode 137, a drain electrode 138, a semiconductor film 110, an n+-zone 135, a p+-zone 136 are laminated in this order. The reference character 110c indicates a channel zone induced in the semiconductor film. In both of the TFTs, there are formed high impurity concentration zones of both polarities, that is, the n+-zone and the p+-zone 136. However, there is different point in that the n+-zone 135 and the p+-zone 136 are formed on the gate electrode in the bipolar TFT T1, and, on the other hand, only a part of the n+-zone 135 is overlapped with the gate electrode and the p+-zone 136 is disposed outside the gate electrode 113 in the monopolar TFT T2. The channel 110c in the semiconductor film 110 is produced in the interface of the semiconductor film 110 in a zone overlapping with the gate electrode and the gate insulator film 140.

In the bipolar TFT, the n+-zone and the p+-zone are overlapped with the gate electrode. On the other hand, in the monopolar TFT T2, a part of the n+-zone 135 is overlapped with the gate electrode, but the p+-zone 136 is not overlapped with the channel at all. Conduction of channel is performed by holes when the gate voltage is negative and by electrons when the gate voltage is positive. The source electrode 137 and the drain electrode 138 come in conduction with a low resistance through the p+-zone 136 in the former and through the n+-zone 135 in the latter. In the TFT T1, the source electrode 137 and the drain electrode 138 come in conduction through the p+-zone 136 when the gate voltage is negative and through the n+-zone 135 when the gate voltage is positive. In the TFT T2, since the n+-zone 135 is overlapped with the gate electrode, current by electrons flows when the gate voltage is positive. However, when the gate voltage is negative, the p+-zone is apart from the channel and there is a high resistance semiconductor film 110 between the p+-zone and the channel. Therefore, the p+-zone and the channel do not come in conduction and current by holes does not flow between them. That is, the TFT T2 is a monopolar (n-type) TFT which become conducting only when the gate voltage is positive.

Figure 2:
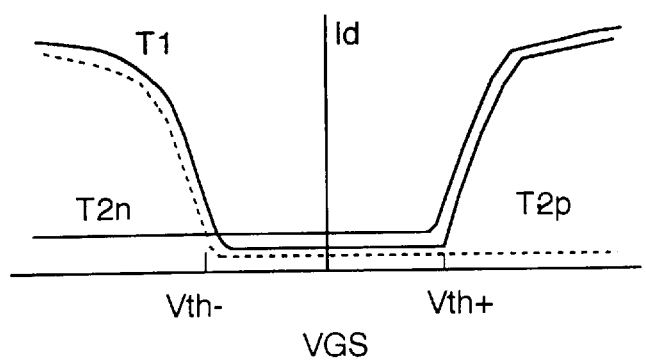
FIG. 2 is a graph showing the characteristics of a bipolar and a monopolar thin film transistors.

FIG. 2 is a graph showing the drain current (ID)-gate voltage (VGS) characteristics of the above TFTs. The reference character T1 indicates the bipolar TFT characteristic and the reference character T2n indicates the n-type monopolar TFT characteristic (the reference character T2p is to be described later). The bipolar TFT T1 becomes conducting at a gate voltage above a positive threshold voltage $V_{th+}$ in the positive side, and at a gate voltage below a negative threshold voltage $V_{th-}$ in the negative side. The monopolar TFT T2 becomes conducting when the gate voltage exceeds the positive threshold voltage $V_{th+}$.

As described with referring to the cross-sectional figure of FIG. 1, the bipolar TFT and the monopolar TFT are distinguished from each other by only positional relationship between the gate electrode and the high impurity concentration zone. That is, different conducting types of TFTs can be obtained by the same basic construction. The TFTs are formed by the same manufacturing process and a new masking process for separately forming the different kind of TFTs is unnecessary. According to the present invention, both of the bipolar TFTs and the monopolar TFTs can be formed at a time through a simple process, which will be described in detail in the second and following embodiments.

The above is a case where the n-type TFTs are used as the monopolar TFTs. The p-type TFTs amy be used as the monopolar TFTs. This case can be obtained by exchanging the positions of the n⁺-zone and the p⁺-zone in the cross-sectional view of the TFT T1 and the TFT T2 of FIG. 1. That is, a p⁺-zone is formed in the position of the n⁺-zone 135 and an n⁺-zone is formed in the position of the p⁺-zone 136. As a result, in the monopolar TFT T2, the n⁺-zone is apart from the gate electrode, that is, apart from the channel. Therefore, in the monopolar TFT T2, the current path by electrons through the n⁺-zone is cut-off and only the current path by holes through the p⁺-zone is formed. Thus, the TFT T2 becomes a p-type monopolar TFT. In this case, since both of the n⁺-zone and the p⁺-zone are in contact with the channel in the TFT T1, the TFT T1 operates as a bipolar TFT. The drain current-gate voltage characteristic of the monopolar TFT T2 is a p-type characteristic shown by a dot line T2$p$ in FIG. 2. The drain current-gate voltage characteristic of the bipolar TFT T1 is a bipolar characteristic as the same as in the preceding embodiment. As the same as in the case where the n-type TFT is used as the monopolar TFT, different conducting types of TFTs can be obtained by the same basic construction, and the TFTs are formed at a time through a simple process.

However, in order to improve each characteristics of the bipolar and the monopolar TFTs, it is preferable that the n⁺-zone and the p⁺-zone are formed on the main surface of the semiconductor film, as shown in FIG. 1. When describing in taking the reverse stagger structure as an example, the channel is produced on the lower surface of the semiconductor film. Between the high concentration impurity zone formed on the semiconductor film and the channel, there is a portion of semiconductor by a length of the semiconductor thickness which is not the channel. When comparing the mobilities of electrons and holes in the semiconductor, the mobility of electrons is higher. That is, electrons are more easily flow in the direction of the film thickness. By forming the n⁺-zone in the high concentration impurity zone formed in the upper surface as shown in FIG. 1, a high conductive current can be obtained. On the other hand, the high concentration impurity zone formed on the side wall of the semiconductor film is in contact with the channel. Therefore, by forming the p⁺-zone on the side wall, a high conductive current can be obtained for conductance of hole having a low mobility. That is, it is possible to obtain a good bipolar TFT having a high conductive current for both operations of n-type and p-type. As for the monopolar TFT, since the mobility of holes in the semiconductor film is low, by forming the high concentration impurity zone apart from the channel it is possible to obtain an ideally operating monopolar TFT in which conduction by holes is very small.

Figure 3:
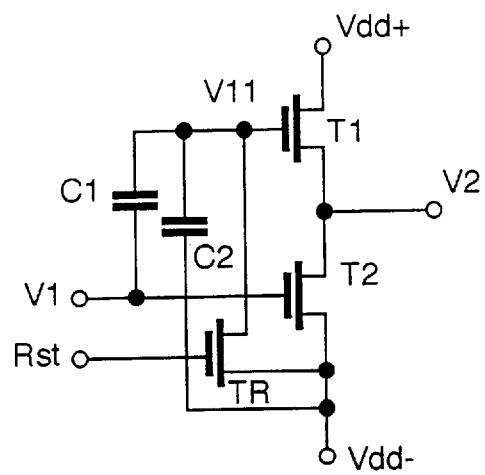
FIG. 3 is a diagram showing an embodiment of an inverter circuit using a thin film transistor in accordance with the present invention.

Description will be made on an example of a circuit to which the bipolar TFT and the monopolar TFT according to the present invention are applied. In this embodiment, basic unit of the circuit is an inverter for reversing signals. FIG. 3 shows a inverter circuit diagram using the bipolar TFT and the monopolar TFT. The bipolar TFT (T1) and the n-type monopolar TFT (T2) are connected between an electric sources Vdd+ and Vdd− in series. Here, it is assumed that |Vdd+|=|Vdd−|=Vdd. Voltages are set so as to satisfy 2Vdd>|$V_{th+}$|>Vdd, 2Vdd>|$V_{th-}$|>vdd. An input voltage V1 is applied to the gate of the n-type TFT of T2. A voltage V11 divided by capacitors C1 and C2 (C1=C2) is input to the gate of the bipolar TFT T1. A monopolar TFT TR is a resetting TFT for correcting shift in the voltage V11 due to leak current of the capacitors C1, C2. The voltage V11 is forced to be reset to Vdd− by periodically conducting the reset voltage Rst to the TFT TR. Here, when resetting, the voltage V1 is set to Vdd−. After resetting, the input voltage V1 is set to a rectangular wave oscillating between Vdd− and Vdd+ (amplitude is 2Vdd). The amplitude 2Vdd is divided by the capacitors C1=C2, and consequently the amplitude of the voltage V11 becomes Vdd. That is, the voltage V11 is oscillated between Vdd− and 0 on the base voltage of reset Vdd−.

When input voltage is Vdd+, the gate voltage VGS, that is, V1−Vdd− of the n-type monopolar TFT T2 becomes 2Vdd which exceeds the threshold voltage $V_{th+}$. Therefore, the TFT T2 becomes conducting. On the other hand, the gate voltage VGS, that is, V11−Vdd+ of the bipolar TFT T1 becomes −Vdd which does not exceed the threshold voltage $V_{th-}$. Therefore, the TFT T1 is cut off. Thus, when the input V1 is Vdd+, the output V2 becomes Vdd−. Next, When the input is Vdd−, the gate voltage VGS of the n-type monopolar TFT T2 becomes 0 which is smaller than the threshold voltage $V_{th+}$. Therefore, the TFT T2 is cut off. On the other hand, the gate voltage VGS of the bipolar TFT T1 is −2Vdd which exceeds the threshold voltage $V_{th-}$. Therefore, the TFT T1 comes in conducting. Thus, when the input V1 is Vdd+, the output V2 becomes Vdd+.

As the result, when the input voltage V1 is Vdd− or Vdd+, the output voltage V2 becomes Vdd+ or Vdd−, respectively. That is, the output voltage V2 becomes the reverse signal of the input voltage V1. It can be understood that the circuit shown in FIG. 3 operates as an inverter. Further, since either of the TFT T1 or the TFT T2 is in cut-off state in any states, the steady-state current flowing between Vdd+ and Vdd− is small. Therefore, the electric power consumed by the circuit is small. Furthermore, since either of the TFTs is in conducting state, the output resistance is small and the operating speed is fast.

Although the bipolar TFT and the n-type TFT are used in this embodiment, the inverter may be constructed using a bipolar TFT and a p-type TFT. That is, the circuit can be obtained by exchanging the TFT T2 and the TR to p-type TFTs in FIG. 3. In this case, a bipolar TFT is used for the TFT T1, as shown in FIG. 3. However, in the actual cross-sectional structure of the TFT, the positions of the n⁺-zone and the p⁺-zone are exchanged and the basic structure becomes the same as that of the p⁺-type TFT. All of the polarities of the power source and the reset signal are reversed to those in FIG. 3, that is, Vdd+ and Vdd− are exchanged to obtain inverter operation. However, since mobility of electrons is higher than the mobility of holes, conductivity of the n-type TFT is higher than that of the p-type TFT. Therefore, the operating speed is higher in the circuit of combination of the n-type TFT and the bipolar TFT.

Description will be made on the construction of the shift register circuit which is a driving portion of the TFT-LCD using such inverters.

The shift register (one stage) is constructed by connecting the inverters of FIG. 3 in two stages.

Figure 4:
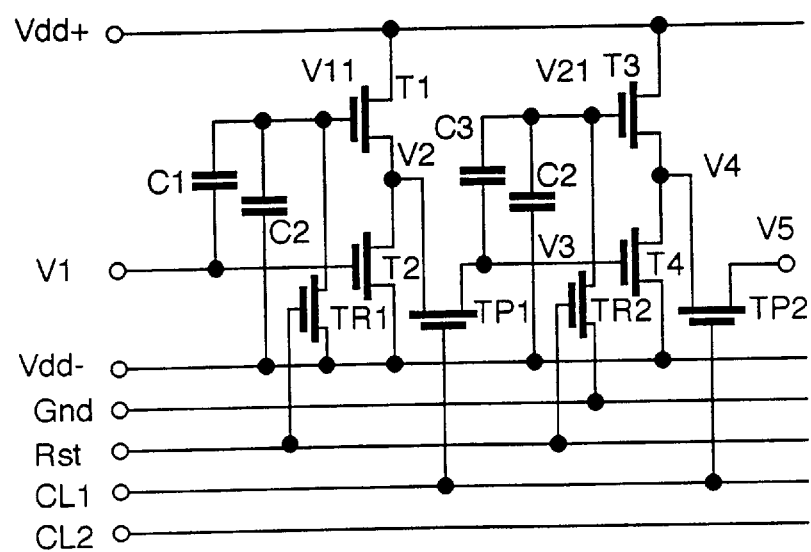
FIG. 4 is a diagram showing an embodiment of a shift register circuit using the inverter circuit shown in FIG. 3.

FIG. 4 shows the circuit of an embodiment of one stage of a shift register. An inverter in the first stage is constructed using a bipolar TFT T1, an n-type monopolar TFT T2, a resetting n-type monopolar TFT TR1 and capacitors C1, C2. An inverter in the second stage having the same construction as in the first stage is constructed using a bipolar TFT T3, an n-type monopolar TFT T4, a resetting n-type monopolar TFT TR2 and capacitors C3, C4. TFTs P1 and P2 are TFTs for data transmission between the inverters, and are n-type TFTs. The reference character $R_{st}$ is a gate voltage reset signal for the bipolar TFTs. A different point between the first stage and the second stage is that the reset voltages supplied through the TFTs R1 and R2 are Vdd− in the first stage and 0 (Gnd) in the second stage. Voltage resetting of the gate voltage of the bipolar TFT is performed by setting all of $R_{st}$, CL1, CL2 to +Vdd to bring all of the TFT TR1, the TP1, the TR2, the TP2 in conducting. When the input V1 is set to Vdd− at resetting, the operation of the first stage becomes the same as the operation described in referring to FIG. 3 and the output V2 becomes Vdd+. At this moment the voltage V21 of the gate electrode of the bipolar TFT T3 is reset to 0. The gate voltage VGS (V21−Vdd+) of the bipolar TFT T3 becomes −Vdd. Since the voltage is below the threshold voltage, the TFT T3 is cut off. On the other hand, the gate voltage VGS (V3−Vdd−) of the bipolar TFT T4 becomes 2Vdd. Since the voltage exceeds the threshold voltage, the TFT T becomes conducting. Since the TFT T3 is cut off and the TFT T4 is conducting, the output V4 becomes Vdd−. After completion of resetting, the TFTs TR1 and TR2 are cut off. When the input V1 changes to Vdd+, the output V2 becomes Vdd−, as described in referring to FIG. 3. Then, when the output voltage V2 of the first inverter oscillates between Vdd+ and Vdd−, the voltage V21 oscillates between 0 and Vdd− by capacitor division through the TFT TP1. When the output voltage V2 is Vdd−, the gate voltage (V3−Vdd−) of the TFT T4 becomes 0 and consequently the TFT T4 is cut off. At this moment, since V21=Vdd−, the gate voltage (V21−Vdd+) of the TFT T3 becomes 2Vdd− and consequently the TFT T3 becomes conducting. Thus, the output V4 becomes Vdd+. As described above, the circuit composed of TFTs T3 and T4 in the second stage also works as an inverter.

Figure 5:
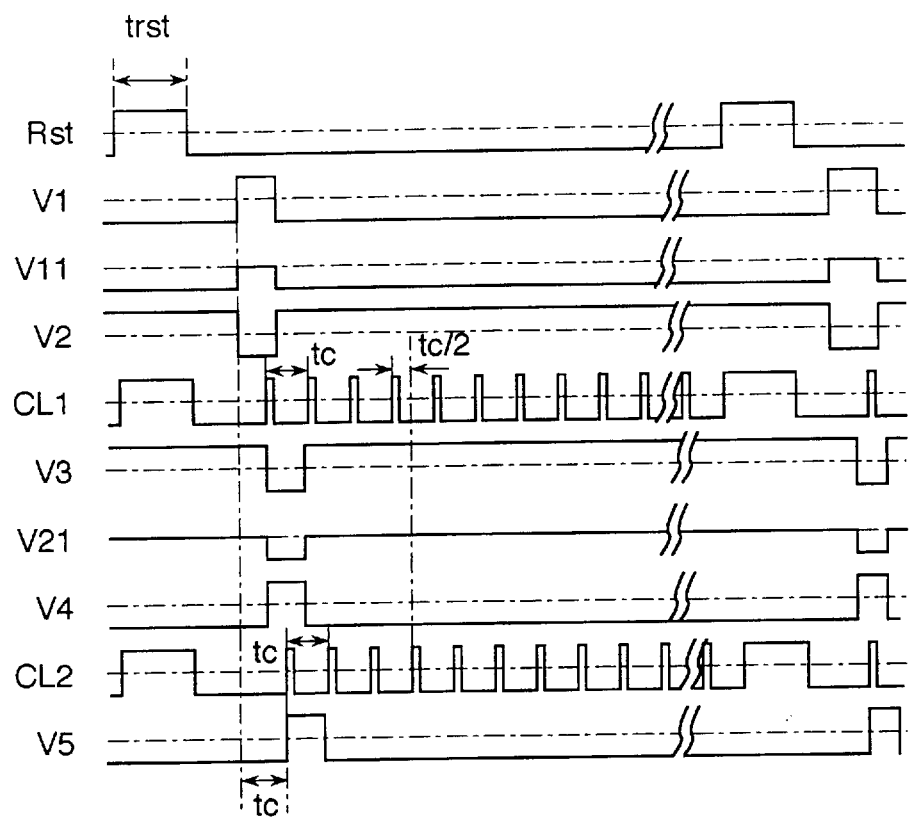
FIG. 5 is a chart showing the drive wave forms of the shift register circuit shown in FIG. 4.

FIG. 5 shows the drive wave forms of the shift register circuit. CL1 and CL2 are 2-phase clock pulses (period tc, phase difference tc/2) for controlling data transmission timing. The CL1 controls the timing for transmitting the output V2 of the inverter in the first stage to the input V3 of the inverter in the second stage. The LC2 controls the timing for transmitting the output V4 of the inverter in the second stage to the input V5 of the shift register in the next stage. V5 has a wave form which is delayed the wave form of V1 by the clock pulse period tc. In the scanning side circuit of the TFT-LCD, the shift registers of this type equal to gate wire number are connected, and the output voltage V5 of the shift registers in the n-stage is transmitted as the input voltage V1 to the shift registers in the (n+1)-stage. At resetting time (tRst), the resetting is performed during returning period of the scanning line because the output of the registers in all stages are required to be set to Vdd−.

Since one of the pair of TFTs composing the inverter becomes cut-off state in any state, the current flowing between Vdd+ and Vdd− is small. Therefore, the electric power consumed by the circuit is small. Further, since the other of the TFT is in conduction, the output resistance is small and the operating speed is fast.

In this circuit, the voltage supplied to the gate of bipolar TFT is generated by dividing by capacitors. Therefore, current does not flow in the dividing circuit except at the time when the input signal is changed, and accordingly the electric power consumed by the dividing circuit is small. Particularly, in a case where frequency of the signal is low and number of pulses per cycle is one (1), the consumed electric power is small. Here, in a case where there is sufficient electric power to be consumed, the dividing is performed using resistors. In the case of resistor-dividing, the transistor for dividing is unnecessary and accordingly there is an advantage in that the peripheral area of the circuit can be decreased and the LCD can be made small in size.

Figure 6:
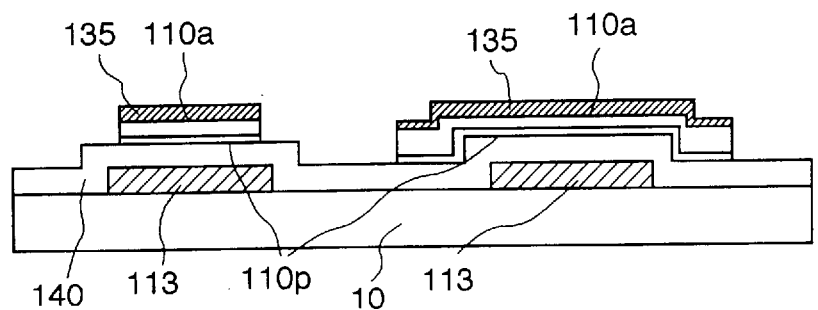
FIG. 6 is a cross-sectional view showing a bipolar and a monopolar thin film transistors in the manufacturing process.
Figure 7:
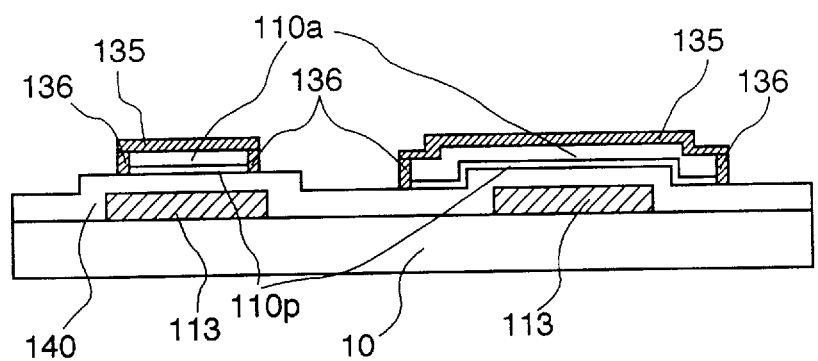
FIG. 7 is a cross-sectional view showing a bipolar and a monopolar thin film transistors in the manufacturing process.
Figure 8:
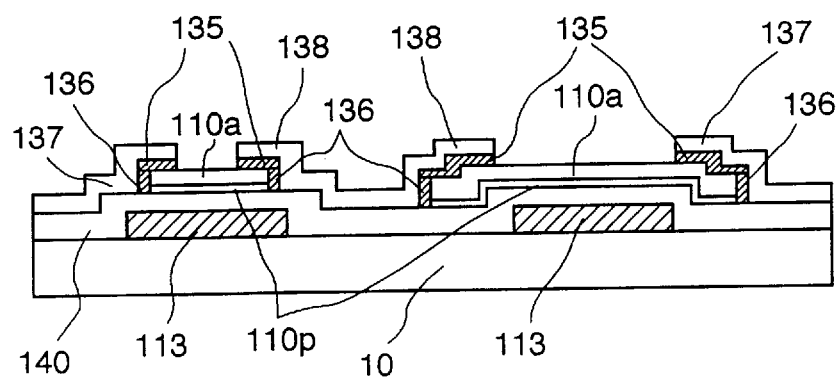
FIG. 8 is a cross-sectional view showing a bipolar and a monopolar thin film transistors in the manufacturing process.

Description will be made on a method of manufacturing the reverse stagger type TFT having an active layer of poly-crystal silicon (p-Si) as a manufacturing method of the bipolar TFT T1 and the monopolar TFT T2. FIG. 6, FIG. 7 and FIG. 8 show cross-sectional structures of the TFTs in the circuit portion in accordance with the present invention. The TFTs in the display portion, which are not shown in the figure, are the n-type monopolar amorphous silicon (a-Si) TFTs, and are manufacture through nearly the same process as the TFT T2 in the figure.

Referring to FIG. 6, a Cr film having a thickness of 120 nm is accumulated onto a glass substrate 10 through the sputter method, and unnecessary portions are removed to form a gate electrode 113. The etching solution used is a cerium nitric etching solution. After that, through the plasma CVD method, a SiN film 140 having a thickness of 350 nm is accumulated at substrate temperature of 300° C., and then an a-Si semiconductor film lip having a thickness of 40 nm is also accumulated at substrate temperature of 270° C. Then, the a-Si film only in the region of forming the peripheral circuit is crystallized through laser annealing. The laser used is an XeCl excimer laser. The irradiation is performed under a condition of energy density of 200 mJ/cm$^2$ in a vacuum environment. In order to prevent the characteristic of the a-Si TFTs in the display region from degradation, dehydrogenation heating treatment before irradiation is not performed. During the irradiation, the substrate is heated to 300° C. using a heating lamp to improve crystallization and homogeneity of the poly-crystal film. Then, a second a-Si semiconductor film 110a as a stopper layer at the later n+Si etching is formed. The substrate is not exposed to atmosphere during the processing from the first Si layer accumulation to the laser irradiation and the second Si layer accumulation. This is for preventing a natural oxidized film from forming in the interface between the two Si layers. Since there is no natural oxidized film, the resistance of the channel from the n+ layer on the upper Si face to the SiN/Si interface can be decreased. After that, the accumulated films of the a-Si semiconductor film 110p, the a-Si semiconductor film 110a are etched to form island-shapes. This etching is performed through the dry etching method using a mixed gas of tri-fluoro-chrolo-carbon and oxygen.

In the island-shaping process, etching is performed using masks of resist patterns for photo-lithography. Boron ion irradiation is performed under condition of leaving the resist as it is. By doing so, the boron is introduced only the side walls of the silicon island to form the p$^+$-zone 136 in the side wall of Si as shown in FIG. 7. The ion doping is performed by a non-mass-separation type ion irradiation apparatus using helium gas diluted diborane as the process gas. The acceleration voltage is 0 kV, and the dose rate is set to 1015 n/cm². In this process, by heating the substrate to, for example, 300° C., the phosphorus (P) implanted into the silicon (Si) is activated and consequently additional activation treatment such as laser irradiation or heating treatment can be eliminated. It is no need to say that activation treatment by heat annealing may be additionally performed to further improve the characteristic.

Then, a molybdenum (Mo) film having a thickness of 200 nm is accumulated in keeping temperature of the substrate at 160° C. through the sputtering method. Following this, the molybdenum is formed into a source electrode 137 and a drain electrode 138 as shown in FIG. 8 using a phosphoric acid-acetic acid mixture (PAN solution).

After that, an ITO film, not shown, for pixel electrode in the display region having a thickness of 140 nm is accumulated in keeping temperature of the substrate at 220° C. The ITO is formed in pixel electrode through the photolithography using HBr solution. An SiN film is accumulated as the protection film for the TFT through the plasma CVD. Finally, the SiN film is photo-etched to expose the signal wire and the gate wire in the same way as the method of forming the gate insulator film, and thus the TFT is completed.

Figure 9:
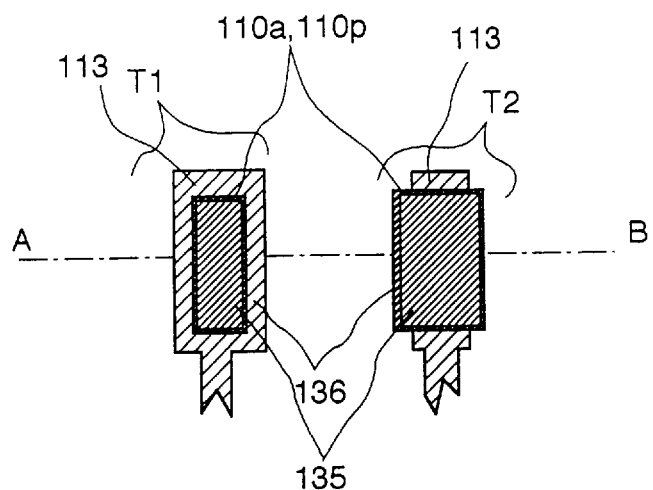
FIG. 9 is a plan view showing a bipolar and a monopolar thin film transistors in the manufacturing process.

FIG. 9 is a plan view showing the portions of the TFTs T1 and T2 in the above process of forming the p⁺-zone (plan view of FIG. 7). The direction of the line A-B in the figure corresponds to the cross-section of FIG. 7. The both semiconductor films 110*a*, 110*p* laminated the poly-Si and the a-Si are formed smaller than the gate electrode 113 in the TFT T1 and are formed larger than the gate electrode 113 in the TFT T2. The n⁺-zone 135 is formed on the all over surface of the semiconductor film. The p⁺-zone 136 is formed on the four sides of the semiconductor film (side walls of the semiconductor film). The width is less than 100 nm.

Figure 10:
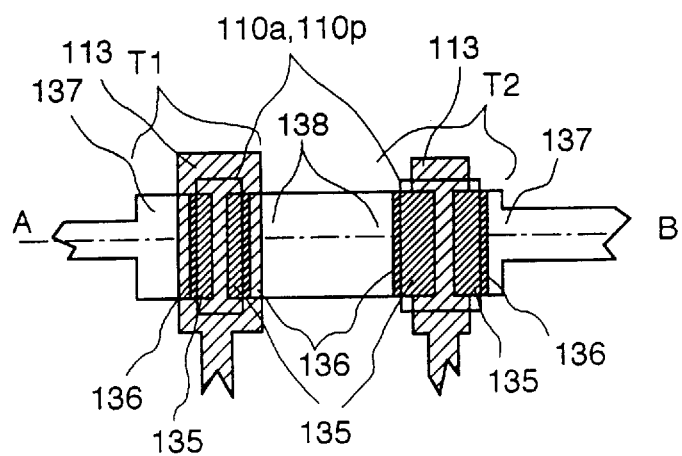
FIG. 10 is a plan view showing a bipolar and a monopolar thin film transistors in the manufacturing process.

FIG. 10 is a plan view showing the portions of the TFTs T1 and T2 in the above process of forming the p⁺-zone (plan view of FIG. 8). The source electrode 137 and the drain electrode 138 are further added in addition to the gate electrode 113, the semiconductor films 110*a*, 110*p* described in referring to FIG. 9. The portion of the n⁺-zone 135 not covered by the source drain electrode is removed by dry-etching. The p⁺-zone formed in the side wall of the semiconductor film is also removed by etching in the lateral direction during the dry-etching, and consequently the p⁺-zone remains only under the source drain electrode. That is, since there are no low resistance n⁺-zone and p⁺-zone in the portion except for the source drain electrode portion, the leakage current of the TFT is small and good switching characteristic can be attained.

Although the basic structure of the pixel TFT is the same as that of circuit TFT, the Si layer of the pixel TFT is composed of two a-Si layers since the pixel TFT is not irradiated with laser. It is important that the pixel TFT has a low OFF current characteristic. Since the pixel TFT is an a-Si TFT, the OFF current is low. Therefore, the cross-sectional structure of the pixel TFT can employ either of the structure of the TFT T1 or the TFT T2.

Figure 11:
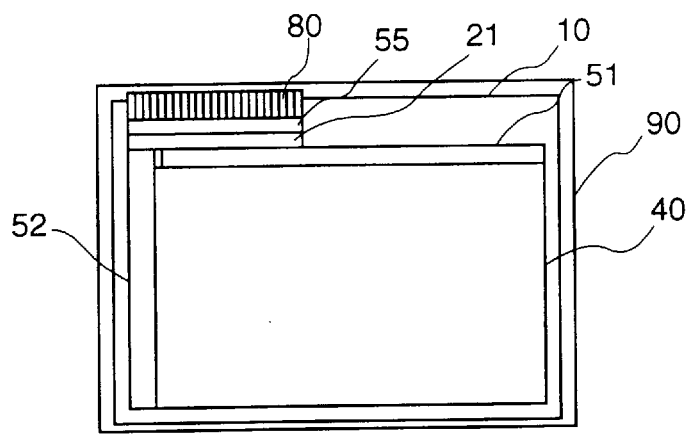
FIG. 11 is a view showing a liquid crystal display apparatus of on-board peripheral circuit type.

FIG. 11 is a plan view showing the structure of the liquid crystal display apparatus in accordance with the present invention. The size of the display region 40 is 72 mm in the vertical direction and 96 mm in the horizontal direction. Number of pixels is 240 vertical×320 horizontal×3 pixels. A display region 40 of active matrix type is incorporated on the grass substrate 10, and an image signal side peripheral circuit 51 and a scanning signal side peripheral circuit 52 are incorporated in the periphery of the display region. Further, a driver LSI 21 is mounted on the substrate through the COG method (chip-on-glass method). Output terminals of the driver are connected to the image signal side peripheral circuit 51 and the scanning signal side peripheral circuit 52. The driver has a function to generate scanning signals, image signals and clock signals. Signals and power electric power from a print board for interface, not shown, placed in the back side surface of the substrate are conducted through an FPC (flexible print circuit) 80 which is connected to one ends of thin film wires 55 on the substrate. In the print board, there are mounted a signal processing circuit composed of ICs such as a timing converter, a tone voltage generating circuit for generating a voltage corresponding to each of tones displayed by the liquid crystal, which are not shown in the figure. The other ends of the thin film wires 55 are connected to the driver LSI 21. These parts described above are contained in a case 90 to construct the liquid crystal display apparatus.

Figure 12:
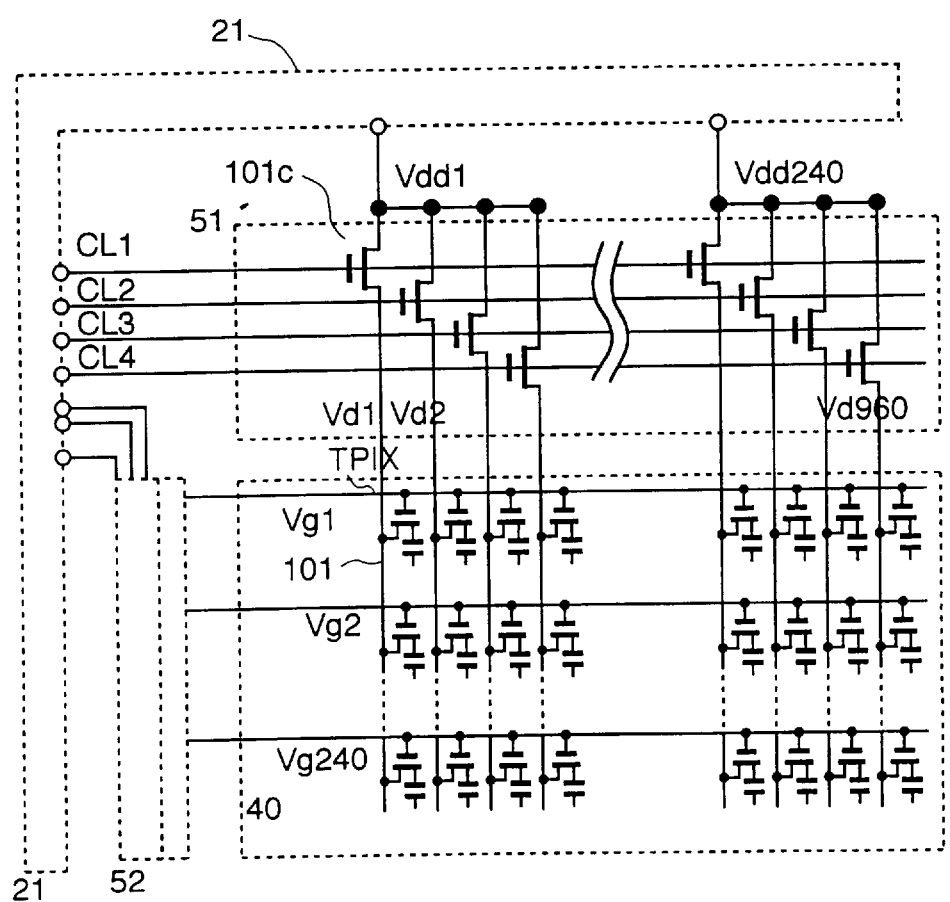
FIG. 12 is a diagram showing an equivalent circuit of pixels and peripheral circuits of the liquid crystal display apparatus shown in FIG. 11.

FIG. 12 shows an equivalent circuits of the display region having pixels of 240×320×3 and the peripheral circuit. Each of liquid crystal capacitor of the pixels is driven by the a-Si n-type monopolar TFT TPIX. The scanning side circuit 52 is of shift register type. Firstly, the image signal side circuit will be described. A image signal and Vdd 1 to Vdd 240 from the driver 21 are branched by an n-type monopolar TFT 101*c* to be supplied to the image signal lines of the display region. The branching of the signal is controlled by switching operation of a sampling TFT 101*c* using clock pulses CL1 to CL4. That is, in a first half of line selection time (35 μs) of pixel, the TFTs are sequentially turned on by the clock signals CL1, CL2, CL3, CL4. In synchronism with this, data from the driver, for instance, in the left end, Vdd1 is sampled, and the image signal s Vd1, Vd2, Vd3 and Vd4 are charged to each of the image signal wires through the TFT 101*c*. The image signals are charged ito the liquid capacitors by the TFTs of the pixels in the last half of the line selection time of pixel. 240 image signal terminals of the driver can drive 960 image signal lines. The scanning side circuit is a circuit connecting 240 stages of the shift register shown in FIG. 4. Output voltage in each stage of the shift registers is supplied to the display portion as scanning signal Vg1, Vg2 or Vg240. At this time, the circuit can be simplified by directly supplying the output of the shift register. The operation can be stabilized by providing a level shift and a buffer circuit between the shift register and the display portion. Each of the level shifter and the buffer circuit can be driven by two phase clock pulses, an input signal (V1 in FIG. 4) to the shift register in the first stage and several number of electric power sources. That is, by incorporating the circuits, number of driver ICs and number of connections can be decreased to one-fourth. Further, the liquid crystal display apparatus, which is small in electric power consumption and small in size, can be manufactured through a simple process.

Since the processing temperature in accordance with the present invention is low, contraction of the glass substrate can be decreased. Since dimensional variation in patterns formed on the substrate is small, the accuracy in positioning the connecting terminals of the substrate and the driver can be improved. It is possible to make the connecting pitches very small, to decrease connecting resistance due to expanding the effective connection area, to decrease failure in connecting process and to shorten the connecting work time.

The following various changes and modification may be made in the aforementioned embodiments of the bipolar TFT and the monopolar TFT in accordance with the present invention without departing form the scope of the present invention.

Although chromium is used as the material for the gate electrode in the above embodiment, the other metals, laminated film or alloys may be used. Although the SiN film is used as the material for the gate insulator film, a film made of $SiO_2$, SiON or the like may be used. In a case where Al or Ta is used as the material for the gate wire, it is possible to improve withstanding voltage of the insulator film and to prevent short-circuit by forming a laminated film using an oxide film obtained by anodizing the Al or the Ta. Although in the embodiment the semiconductor film is formed in the a-Si film through the plasma CVD or in the poly-crystal Si film through the laser annealing, the other manufacturing methods may be employed. For example, a Ge film, or a mixed crystal film or an ultra-structure film of Ge and Si may be accumulated through the plasma CVD using german gas as the processing gas. As for the method of accumulating semiconductor film, it is possible to employ the depressurized CVD method which does not affect plasma damage, the sputter method which can decrease hydrogen content in the film, or the ECR-CVD method which can prevent instability of the film and can decrease the process temperature. Further, an alloy film or a laminated film containing these may be used.

When the $p^+$-zone is formed in the embodiment, p-type impurity is irradiated by using the resist film used for patterning the semiconductor film as a mask. However, the irradiation may be performed without the mask. In this case, the p-type impurity is also introduced in an $n^+$-type zone having been formed in advance. Therefore, the impurity concentration of the $n^+$-type zone has been set to a sufficiently higher value than the p-type concentration to be irradiated. By doing so, effect of the p-type does not appear and the $n^+$-type zone can maintain its function even if the p-type impurity is irradiated.

When the semiconductor film is formed into island-shapes in the embodiment, the side surface of the island-shaped portion may be tapered. By doing so, the impurity irradiation density to the side wall is increased to make the impurity concentration high, and to obtain high conducting current, and to shorten the processing by decreasing the irradiation time. Further, it is possible to decrease irradiation damage. Furthermore, adhesivility of the source drain electrode is improved.

Figure 13:
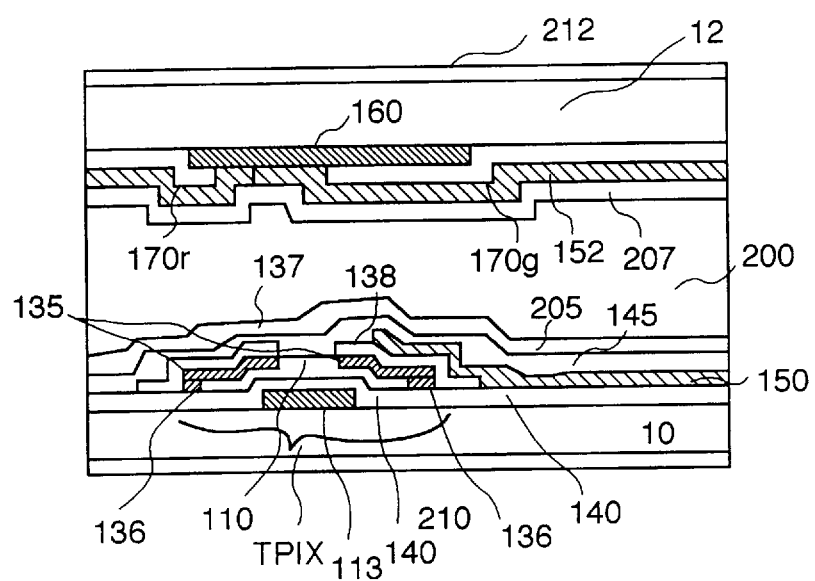
FIG. 13 is a cross-sectional view showing a pixel of a liquid crystal display apparatus.
Figure 14:
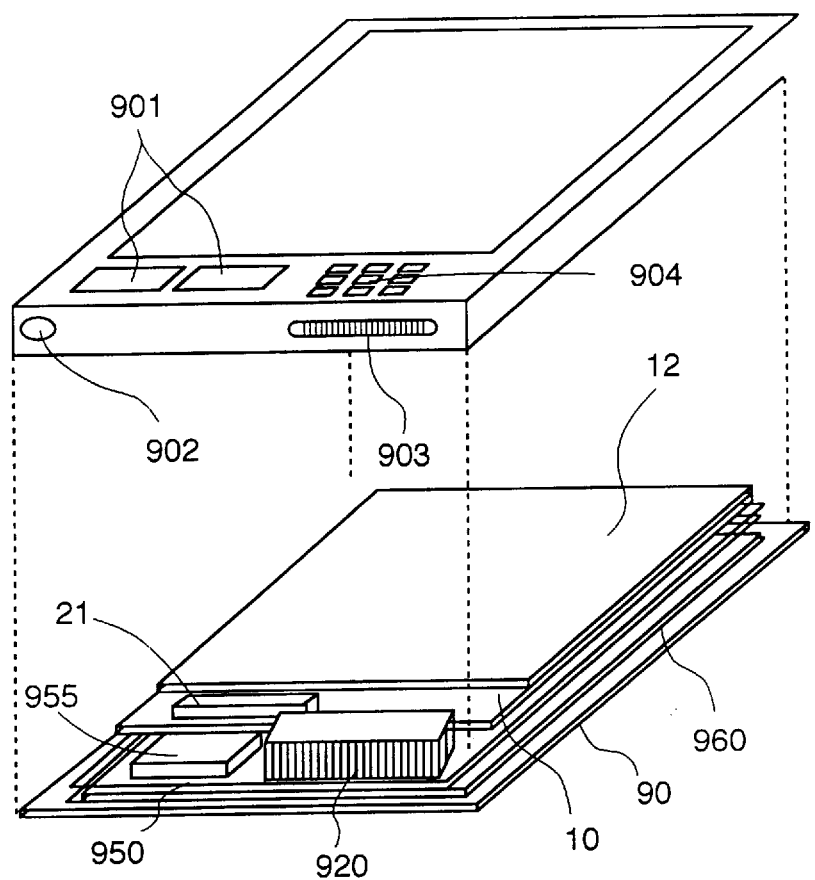
FIG. 14 is a view showing the outline of an information processing apparatus using a liquid crystal display apparatus to which the present invention is applied.

FIG. 13 is a cross-sectional view showing one pixel portion of a liquid crystal display apparatus. On a glass substrate 10, a TFT TPIX for driving the pixel, a pixel electrode 150 and so on are formed on the surface in contact with the liquid crystal 200. The structure of the TFT TPIX is the same as that of the n-type TFT in the aforementioned circuit except for that the semiconductor film 110 is made of an a-Si. That is, a gate electrode 113, a gate insulator film 140, a semiconductor film 110, source drain electrodes 137, 138 and protective film are successively laminated. The pixel electrode 150 is connected to the source electrode 150. An orientation film 205 for aligning the molecules of the liquid crystal is formed through the spinner application and the rubbing treatment. a polarizing plate 210 is stuck onto the opposite side to the liquid crystal. On the inside surface 12 of an opposite glass substrate, a Cr black matrix 160 for interrupting light leaking from the region other than the pixel electrodes, color filters 170r, 170g formed by applying an organic resin trough roll coating and then dyeing, an opposite electrode 152 and an orientation film 207 are successively formed. A polarizing plate 212 is stuck onto the outer surface. The gap between the both substrates is set to nearly 5 μm, and the peripheral portion of the substrates is fixed using a resin, not shown. After that, a nematic type liquid crystal is filled and sealed in the gap. The polarizing directions of the polarizing plates 210 and 212 are crossed at right angle to each other, and the rubbing directions of the orientation films 205 and 207 are crossed at right angle to each other. The display mode becomes normally white mode in which light is transmitted when voltage is not applied to the liquid crystal. A back light, not shown, is placed at the back of the glass substrate 10 to irradiate the liquid crystal. The polarizing films 210, 212 are stuck to the outer side surface of the glass substrate. Amount of the transmitted light is controlled by the voltage applied to the liquid crystal to display an image. FIG. 14 shows a portable information processing apparatus using the liquid crystal display apparatus. The portable information processing apparatus is a note-type personal computer having communication function. The portable information processing apparatus comprises a CPU board 950 having an information processing function centering a micro-processor, a chargeable battery 920 for supplying electric power to the whole system in the personal computer, a key board 904 for inputting numerical data, an information processing menu selecting switch 901 and a memory card 960 for recording data. Signal input and output between the external is performed by using a connecting terminal 903 and a transmission and receiving element 902. Since the consumed electric power by the peripheral circuit is decreased, the battery for the electric power source can be made small in size and light in weight. Accordingly, the structural member containing and holding the parts can be directly and indirectly made small in size, light in weight and thin in thickness, the note-type personal computer is improved in portability. Since the time between charges can be extended, the usability can be improved.

The LCD in accordance with the present invention has an effect in that not only this embodiment but the other potable information processing apparatuses can be made small in size, light in weight and long in battery life. For example, it is effective to apply the LCD in accordance with the present invention to apparatuses such as a cellular telephone, a portable game apparatus, a portable information apparatus for sales/order management used in a retail store and so on in which information processing is performed by an integrated circuit using a battery electric power.

Figure 15:
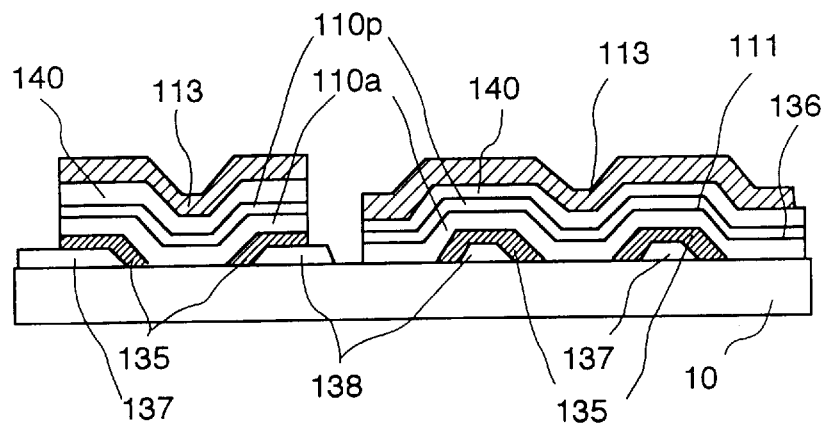
FIG. 15 is a cross-sectional view showing another embodiment of thin film transistors in the manufacturing process.
Figure 16:
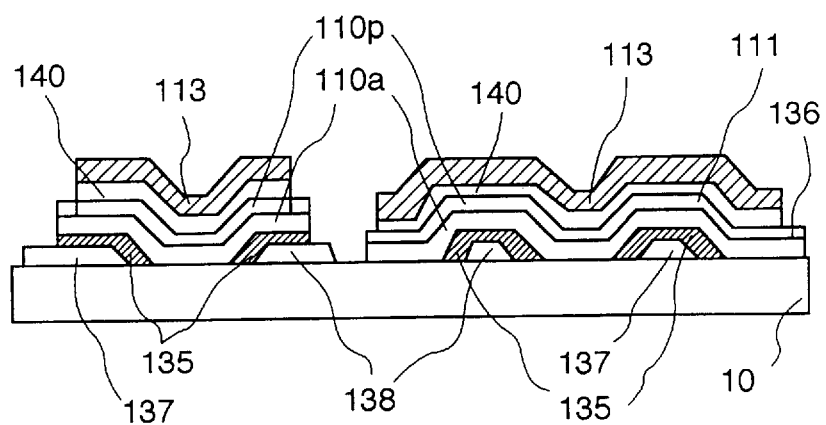
FIG. 16 is a cross-sectional view showing another embodiment of thin film transistors in the manufacturing process.
Figure 17:
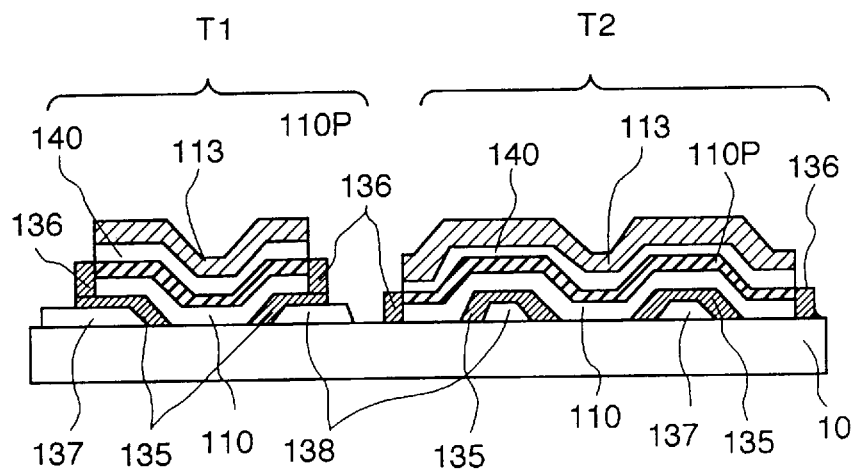
FIG. 17 is a cross-sectional view showing another embodiment of thin film transistors in the manufacturing process.

Further, description will be made on a method of manufacturing a monopolar and a bipolar TFTs of positive stagger structure. FIG. 15, FIG. 16 and FIG. 17 are cross-sectional views showing a monopolar and a bipolar TFTs (T1, T2) of positive stagger structure in the manufacturing process.

Referring to FIG. 15, an ITO film is accumulated onto a glass substrate 10 through the sputter method, and source electrodes 137 and gate electrodes 138 are formed. Then, the substrate is exposed in a phosphine plasma to deposit phosphorus (P) onto the surface of the source drain electrodes of the ITO. After that, a semiconductor film 110a is accumulated through the plasma CVD method. By doing so, the phosphorus diffuses into a zone of the silicon contacting to the ITO to form an $n^+$-zone 135. Then, the silicon surface is crystallized by irradiating excimer laser irradiation. Following that, a gate insulator film of SiN 140 is accumulated through the plasma CVD method. Then, a chromium film is accumulated through the sputtering method to form a gate electrode shape 113 through the photo-lithography. In that time, the dry etching of the SiN and the Si is performed under condition of leaving the photo-resist as it is to form a n SiN 140 and a-Si semiconductor film 110a, 110p islands having the same shape as that of the gate electrode.

By etching the gate electrode 113 and the SiN 140 under condition of leaving the photo-resist again, etching region is progressed in the lateral direction from the edge surfaces of the photo-resist. As the result, it is possible to obtain a structure in which the silicon film is extended out of the edge portion of the gate electrode as shown in FIG. 16.

Boron is irradiated under this state. By doing so, the region of the silicon layer where the gate is depressed can be changed to a P$^+$-zone 136 as shown in FIG. 17. Thus, it is possible to obtain a TFT of positive stagger type having the n$^+$-zone and the p$^+$-zone shown in FIG. 16. A bipolar TFT (T1) can be obtained when the edge portion of the gate electrode is formed above the drain electrode, and a monopolar TFT (T2) can be obtained when the edge portion of the gate electrode is formed outside the source drain electrode. Therefore, TFTs having different characteristic can be formed in a single process.

As having been described above, according to the present invention, both of a bipolar and a monopolar thin film transistors can be manufactured through a simple process, and an inverter and a liquid crystal display apparatus of small consuming electric power can be realized by using the bipolar and the monopolar thin film transistors.

What is claimed is:

1. A liquid crystal display apparatus, comprising:
   a pair of substrates, at least one of said pair of substrates being transparent, a liquid crystal layer formed by filling a liquid crystal material between said pair of substrates;
   one of said pair of substrates comprising a display region having a plurality of first semiconductor elements disposed on a matrix and a peripheral circuit region having a plurality of second semiconductor elements and being disposed on the periphery of said display region to drive said plurality of first semiconductor elements;
   each of said plurality of second semiconductor elements in said peripheral circuit region having a bipolar semiconductor element and a monopolar semiconductor element; and
   wherein said first and second semiconductor elements are thin film semiconductor elements, respectively, and said bipolar and monopolar thin film semiconductor elements, composing said second semiconductor element, have a gate electrode formed on said substrate and a semiconductor layer formed on the gate electrode through an insulator film, said semiconductor layer having a p$^+$-zone and an n$^+$-zone respectively disposed adjacent both sides of said gate electrode.

2. A liquid crystal display apparatus according to claim 1, wherein said bipolar and monopolar semiconductor elements composing each second semiconductor element are configured as an inverter.

3. A liquid crystal display apparatus according to claim 2, wherein plural ones of said inverter are configured as a shift register.

4. A liquid crystal display apparatus according to claim 1, wherein a semiconductor layer of said first semiconductor element formed in said display region is made of amorphous silicon and the semiconductor layer of said second semiconductor element formed in said peripheral circuit region is made of polycrystalline silicon.

5. A liquid crystal display apparatus according to claim 1, wherein said p$^+$-zone and said n$^+$-zone in said semiconductor layer of said bipolar thin film semiconductor element are disposed within the range of the region of the gate electrode as seen from the vertical direction of said substrate.

6. A liquid crystal display apparatus according to claim 5, wherein said n$^+$-zone of said bipolar thin film semiconductor element is formed on said p$^+$-zone.

7. A liquid crystal display apparatus according to claim 6, wherein said n$^+$-zone of said bipolar thin film semiconductor element overlaps with a channel zone of said semiconductor layer.

8. A liquid crystal display apparatus according to claim 1, wherein one of said p$^+$-zone and said n$^+$-zone in said semiconductor layer of said monopolar thin film semiconductor element is disposed outside the range of the region of the gate electrode as seen from the vertical direction of said substrate.

9. A liquid crystal display apparatus according to claim 8, wherein one of said p$^+$-zone and said n$^+$-zone in said semiconductor layer of said monopolar thin film semiconductor element overlaps with a channel zone of said semiconductor layer.

10. A liquid crystal display apparatus according to claim 9, wherein said p$^+$-zone in said semiconductor layer of said monopolar thin film semiconductor element is positioned outside the range of the region of the gate electrode as seen from the vertical direction of said substrate and said n$^+$-zone overlaps with a channel zone of said semiconductor layer.

11. A liquid crystal display apparatus according to claim 7, wherein a semiconductor layer of said thin film semiconductor element formed in said display region is made of amorphous silicon and the semiconductor layer of said thin film semiconductor element formed in said peripheral circuit region is made of polycrystalline silicon.

12. A liquid crystal display apparatus according to claim 1, wherein each of said first semiconductor elements in said display region is a monopolar thin film semiconductor element.

13. A liquid crystal display apparatus according to claim 12, wherein:
   each of said monopolar semiconductor elements in said display region has a gate electrode formed on said substrate and a semiconductor layer formed on the gate electrode through an insulator film;
   said semiconductor layer has a p$^+$-zone and an n$^+$-zone respectively disposed adjacent both sides of said gate electrode; and
   one of said p$^+$-zone and said n$^+$-zone in said semiconductor layer is disposed outside the range of the region of the gate electrode as seen from the vertical direction of said substrate.

14. A liquid crystal display apparatus according to claim 1, wherein each of said first semiconductor elements in said display region is a bipolar thin film semiconductor element.

15. A liquid crystal display apparatus according to claim 14, wherein:
   each of said bipolar thin film semiconductor elements in said display region has a gate electrode formed on said substrate and a semiconductor layer formed on the gate electrode through an insulator film;
   said semiconductor layer has a p$^+$-zone and an n$^+$-zone respectively disposed adjacent both sides of said gate electrode; and
   one of said p$^+$-zone and said n$^+$-zone in said semiconductor layer is disposed outside the range of the region of the gate electrode as seen from the vertical direction of said substrate.

16. An information processing apparatus, which comprises:

the liquid crystal display apparatus as defined in claim 1;

a controller for supplying control signals to a peripheral circuit region of said liquid crystal display apparatus and;

a communication unit for supplying external signals to said controller.

17. A semiconductor device comprising a substrate, and monopolar thin film semiconductor elements and bipolar thin film semiconductor elements formed on said substrate, wherein:

each monopolar thin film semiconductor element and each bipolar thin film semiconductor element has a gate electrode formed on said substrate and a semiconductor layer formed on the gate electrode through an insulator film;

said semiconductor layer has a $p^+$-zone and an $n^+$-zone respectively disposed adjacent both sides of said gate electrode;

one of said $p^+$-zone and said $n^+$-zone in said semiconductor layer of said monopolar thin film semiconductor element is disposed outside the range of the region of the gate electrode as seen from the vertical direction of said substrate; and said $p^+$-zone and said $n^+$-zone in said semiconductor layer of said bipolar thin film semiconductor element are disposed within the range of the region of the gate electrode as seen from the vertical direction of said substrate.

18. A semiconductor device according to claim 17, wherein one of said $p^+$-zone and said $n^+$-zone in said semiconductor layer of said monopolar thin film semiconductor element overlaps with a channel zone of said semiconductor layer.

19. A semiconductor device according to claim 18, wherein said $p^+$-zone in said semiconductor layer of said monopolar thin film semiconductor element is positioned outside the range of the region of the gate electrode as seen from the vertical direction of said substrate and said $n^+$-zone overlaps with a channel zone of said semiconductor layer.

20. A semiconductor device according to claim 19, wherein said $n^+$-zone is formed on said $p^+$-zone in said semiconductor layer of said bipolar thin film semiconductor element.

21. A semiconductor device according to claim 20, wherein said $n^+$-zone of the semiconductor layer of said bipolar thin film semiconductor element overlaps with a channel zone of said semiconductor layer.

* * * * *